United States Patent
Yu et al.

(10) Patent No.: US 8,274,071 B2
(45) Date of Patent: *Sep. 25, 2012

(54) MOS DEVICES WITH PARTIAL STRESSOR CHANNEL

(75) Inventors: Ming-Hua Yu, Jhubei (TW); Mong-Song Liang, Hsin-Chu (TW); Tze-Liang Lee, Hsin-Chu (TW); Jr.-Hung Li, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/985,507

(22) Filed: Jan. 6, 2011

(65) Prior Publication Data

US 2011/0101305 A1   May 5, 2011

Related U.S. Application Data

(60) Continuation of application No. 12/467,847, filed on May 18, 2009, now Pat. No. 7,868,317, which is a division of application No. 11/732,380, filed on Apr. 3, 2007, now Pat. No. 7,554,110.

(60) Provisional application No. 60/844,786, filed on Sep. 15, 2006.

(51) Int. Cl.
   *H01L 29/06* (2006.01)

(52) U.S. Cl. .......... 257/18; 257/255; 257/408; 257/638; 257/E29.193; 257/E21.431; 438/938

(58) Field of Classification Search .......... 257/18, 257/255, 408, 638, E29.193; 438/938
See application file for complete search history.

(56) References Cited

U.S. PATENT DOCUMENTS

| | | | |
|---|---|---|---|
| 6,124,614 A | 9/2000 | Ryum et al. | |
| 6,252,295 B1 | 6/2001 | Cote et al. | |
| 6,274,894 B1 | 8/2001 | Wieczorek et al. | |
| 6,563,152 B2 | 5/2003 | Roberds et al. | |
| 6,605,498 B1 | 8/2003 | Murthy et al. | |
| 6,787,793 B2 | 9/2004 | Yoshida | |
| 6,825,086 B2 | 11/2004 | Lee et al. | |
| 6,858,506 B2 | 2/2005 | Chang | |
| 7,078,742 B2 * | 7/2006 | Lin et al. | 257/190 |
| 2001/0037760 A1 | 11/2001 | Solomon et al. | |
| 2006/0084247 A1 | 4/2006 | Liu | |
| 2006/0115933 A1 | 6/2006 | Ye et al. | |
| 2006/0148151 A1 | 7/2006 | Murthy et al. | |
| 2006/0186484 A1 | 8/2006 | Chau et al. | |
| 2006/0220113 A1 * | 10/2006 | Tamura et al. | 257/335 |
| 2006/0237746 A1 * | 10/2006 | Orlowski et al. | 257/192 |
| 2006/0260538 A1 | 11/2006 | Ye et al. | |
| 2006/0292878 A1 | 12/2006 | Hara | |
| 2007/0020864 A1 | 1/2007 | Chong et al. | |
| 2007/0096148 A1 | 5/2007 | Hoentschel et al. | |
| 2007/0096149 A1 | 5/2007 | Liu et al. | |

OTHER PUBLICATIONS

Synopsys, Inc., Presentation, 2 pages, 2005.

* cited by examiner

*Primary Examiner* — Tu-Tu Ho
(74) *Attorney, Agent, or Firm* — Slater & Matsil, L.L.P.

(57) ABSTRACT

A semiconductor structure includes a semiconductor substrate having a first lattice constant; a gate dielectric on the semiconductor substrate; a gate electrode on the semiconductor substrate; and a stressor having at least a portion in the semiconductor substrate and adjacent the gate electrode. The stressor has a tilted sidewall on a side adjacent the gate electrode. The stressor includes a first stressor layer having a second lattice constant substantially different from the first lattice constant; and a second stressor layer on the first stressor layer, wherein the second stressor has a third lattice constant substantially different from the first and the second lattice constants.

23 Claims, 6 Drawing Sheets

MOS DEVICES WITH PARTIAL STRESSOR CHANNEL

This application is a continuation of U.S. patent application Ser. No. 12/467,847, entitled "MOS Devices with Partial Stressor Channel," filed on May 18, 2009, now U.S. Pat. No. 7,868,317, which application is a divisional of U.S. patent application Ser. No. 11/732,380, entitled "MOS Devices with Partial Stressor Channel," filed on Apr. 3, 2007, now U.S. Pat. No. 7,554,110, issued Jun. 30, 2009, which application relates to and claims the benefit of U.S. Provisional Patent Application Ser. No. 60/844,786, filed Sep. 15, 2006, entitled "MOS Devices with Partial Stressor Channel," all of which patent applications are incorporated herein by reference.

TECHNICAL FIELD

This invention relates generally to integrated circuits, and more particularly to structure and formation methods of MOS devices with channel stressors.

BACKGROUND

Reductions in sizes and inherent features of semiconductor devices have enabled continued improvements in speed, performance, density, and cost per unit function of integrated circuits over the past few decades. With the continuous scaling of integrated circuits, the conventional methods for improving performance of metal-oxide-semiconductor (MOS) devices, such as shortening gate lengths of MOS devices, has run into bottlenecks. To further enhance the performance of MOS devices, stress may be introduced in the channels of the MOS devices to improve carrier mobility. Generally, it is desirable to induce a tensile stress in the channel region of an n-type MOS (NMOS) device in a source-to-drain direction and to induce a compressive stress in the channel region of a p-type MOS (PMOS) device in a source-to-drain direction.

A commonly used method for applying compressive stress to the channel regions of PMOS devices is to grow SiGe stressors in source and drain regions. Such a method typically includes the steps of forming a gate stack on a semiconductor substrate; forming gate spacers on sidewalls of the gate stack; forming recesses in the silicon substrate along the gate spacers; epitaxially growing SiGe stressors in the recesses; and then annealing. Since SiGe has a greater lattice constant than silicon has, it applies a compressive stress to the channel region, which is located between a source SiGe stressor and a drain SiGe stressor. Similarly, for NMOS devices, stressors that may introduce tensile stresses, such as SiC stressors, may be formed.

The conventional stressor formation processes suffer drawbacks, however. FIG. 1 illustrates a conventional MOS device. A MOS device including source stressor 4 and drain stressor 6 are formed in substrate 2, wherein the bottom corners of source stressor 4 and drain stressor region 6 have a distance D. To increase the stress applied to the channel region, distance D is preferably small. Methods for forming stressors 4 and 6 closer to the channel region are thus explored. However, the decrease in distance D may result in a punch-through between source and drain regions, and a leakage current may flow between source and drain regions in path 8 below the channel region. This problem is further worsened due to the scaling down of integrated circuits, which causes distance D to further decrease.

What is needed in the art, therefore, is a novel MOS device that may take advantage of increased channel stress by reducing the distance between a source stressor and a drain stressor while at the same time overcoming the deficiencies of the prior art.

SUMMARY OF THE INVENTION

In accordance with one aspect of the present invention, a semiconductor structure includes a semiconductor substrate having a first lattice constant; a gate dielectric on the semiconductor substrate; a gate electrode on the semiconductor substrate; and a stressor having at least a portion in the semiconductor substrate and adjacent the gate electrode. The stressor has a tilted sidewall on a side adjacent the gate electrode. The stressor includes a first stressor layer having a second lattice constant substantially different from the first lattice constant; and a second stressor layer on the first stressor layer, wherein the second stressor has a third lattice constant substantially different from the first and the second lattice constants.

In accordance with another aspect of the present invention, a MOS device includes a semiconductor substrate; a gate dielectric on the semiconductor substrate; a gate electrode on the gate dielectric; a gate spacer on a sidewall of the gate electrode; a recess in the semiconductor substrate and adjacent the gate electrode, wherein a sidewall of the recess is substantially straight and tilted; and a stressor in the recess, wherein the stressor comprises a tip portion under the gate electrode.

In accordance with yet another aspect of the present invention, a semiconductor structure includes a semiconductor substrate; a gate stack on the semiconductor substrate; a gate spacer on a sidewall of the gate stack; and a lightly doped source or drain (LDD) region comprising a different material from the semiconductor substrate. The LDD region has at least a portion underlying the gate spacer, and a substantially straight tilted interface with the semiconductor substrate. The semiconductor structure further includes a source/drain region adjacent the gate spacer, wherein the source/drain region and the LDD region comprise an element selected from the group consisting essentially of germanium and carbon, and wherein atomic percentages of the element in the LDD region and at least a portion of the source/drain region are different.

In accordance with yet another aspect of the present invention, a method of forming a semiconductor structure includes providing a semiconductor substrate having a first lattice constant; forming a gate dielectric on the semiconductor substrate; forming a gate electrode on the semiconductor substrate; and forming a stressor having at least a portion in the semiconductor substrate and adjacent the gate stack, wherein the stressor has a tilted sidewall on a side adjacent the gate electrode. The step of forming the stressor includes forming a first stressor layer having a second lattice constant substantially different from the first lattice constant; and forming a second stressor layer on the first stressor layer, wherein the second stressor has a third lattice constant substantially different from the first and the second lattice constants.

In accordance with yet another aspect of the present invention, a method of forming a semiconductor structure includes providing a semiconductor substrate; forming a gate stack on the semiconductor substrate; forming a gate spacer on a sidewall of the gate stack; anisotropically forming a first recess in the semiconductor substrate and adjacent the gate spacer; and expanding the first recess to form a second recess in the semiconductor substrate by etching. The step of etching is free from plasma. The second recess extends under the gate stack. The method further includes growing a stressor in the first and the second recesses.

The advantageous features of the present invention include reduced probability of punch-through and increased stress in the channel region.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for forming MOS devices having channel stressors is provided. The intermediate stages of manufacturing embodiments of the present invention are illustrated in FIGS. 2 through 11. Throughout the various views and illustrative embodiments of the present invention, like reference numbers are used to designate like elements.

Figure 1:
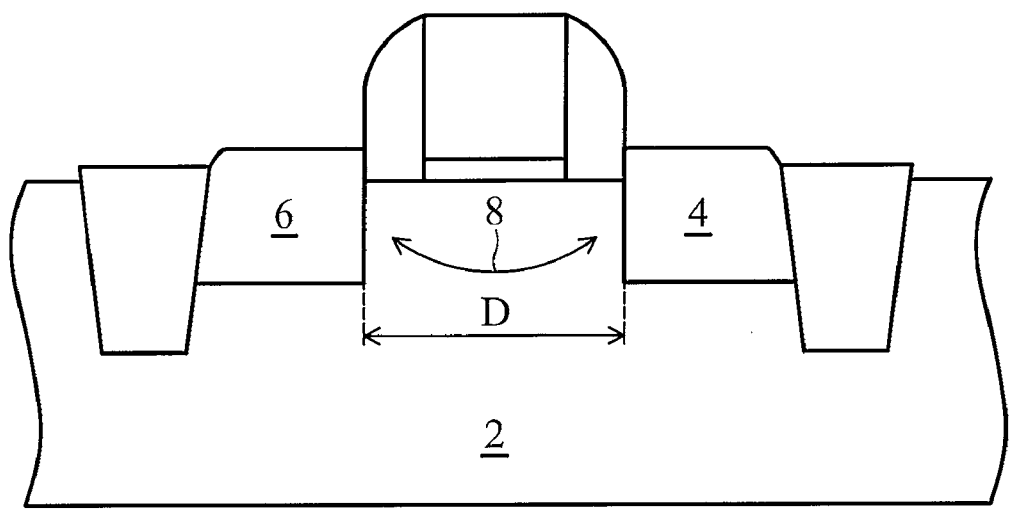
FIG. 1 illustrates a conventional MOS device having channel stressors.
Figure 2:
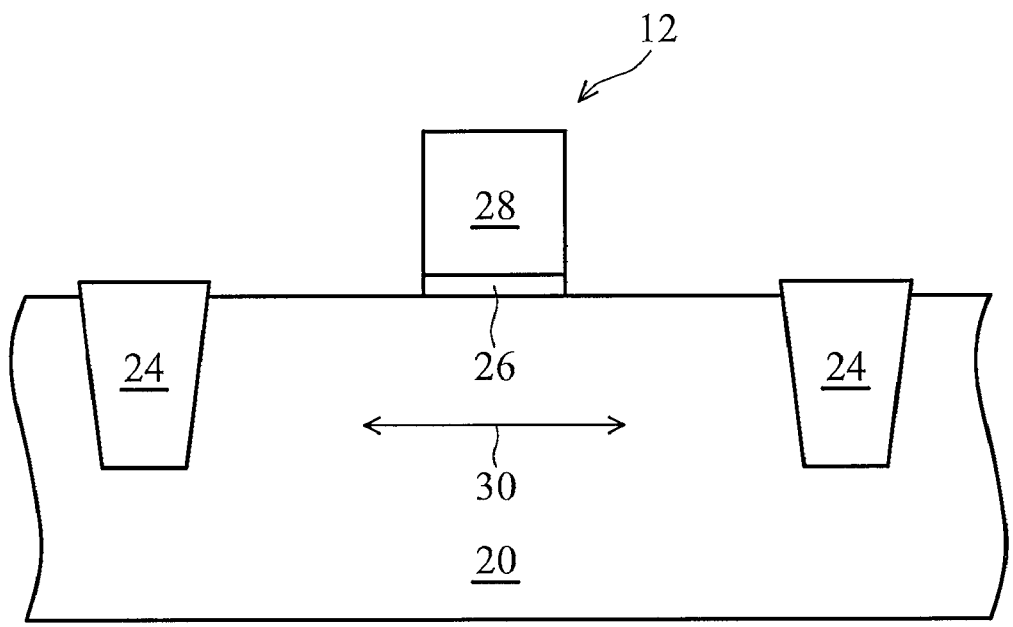
FIGS. 2 through 11 are cross-sectional views of intermediate stages in the manufacturing of embodiments of the present invention.

FIG. 2 illustrates a substrate 20. Preferably, substrate 20 comprises bulk silicon. Alternatively, substrate 20 comprises bulk SiGe or other semiconductor materials. Substrate 20 may also have a composite structure such as silicon-on-insulator (SOI) structure. Shallow trench isolation (STI) regions 24 may be formed in substrate 20 to isolate device regions. As is known in the art, STI regions 24 may be formed by etching substrate 20 to form recesses, and then filling the recesses with dielectric materials such as high-density plasma oxide.

A gate stack 12 comprising a gate dielectric 26 and a gate electrode 28 is formed on substrate 20. Gate dielectric 26 may include commonly used dielectric materials such as oxides, nitrides, oxynitrides, and combinations thereof. Gate electrode 28 may include doped polysilicon, metals, metal silicides, metal nitrides, and combinations thereof. As is known in the art, gate dielectric 26 and gate electrode 28 are preferably formed by depositing a gate electrode layer on a gate dielectric layer, and then patterning the gate electrode layer and the gate dielectric layer.

In the resulting MOS device, a channel will be formed under gate stack 12. Preferably, the channel length direction of the MOS device, as illustrated by arrow 30, is in (1, 1, 0) direction of substrate 20.

Optionally, lightly doped source/drain (LDD) regions (not shown) are formed, preferably by implanting p-type or n-type impurities, wherein the conductivity type of the impurities depend on the desired type of the resulting MOS devices. Gate stack 12 acts as a mask so that LDD regions are substantially aligned with the edges of the respective gate stack 12. Halo and/or pocket regions (not shown) may also be formed with impurities having opposite conductivity type as the LDD regions.

Figure 3:
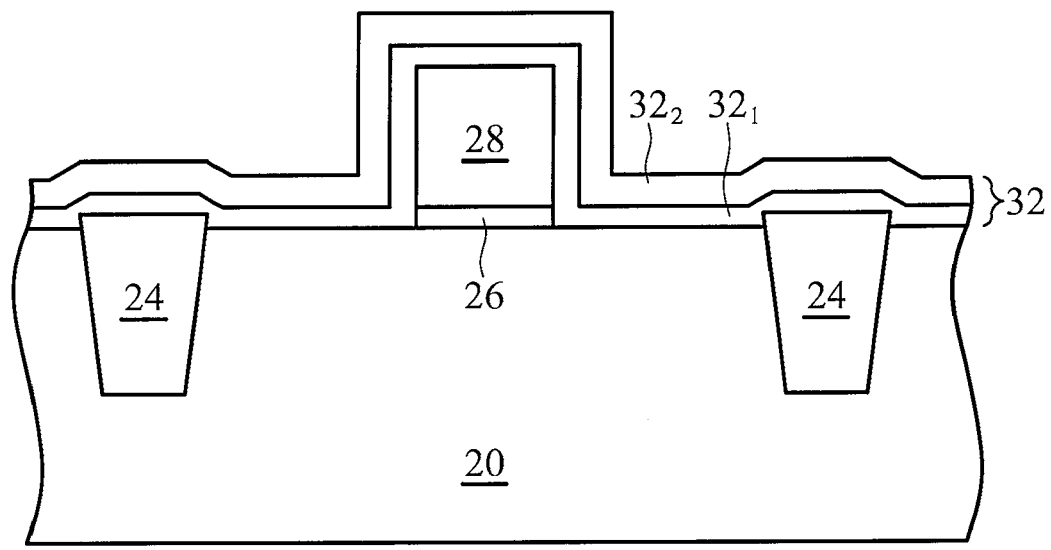

Referring to FIG. 3, gate spacer layer 32 is formed. In the preferred embodiment, gate spacer layer 32 includes a liner oxide layer $32_1$ and an overlying nitride layer $32_2$. In alternative embodiments, gate spacer layer 32 may include a single layer or more than two layers, each comprising oxide, silicon nitride, silicon oxynitride (SiON) and/or other dielectric materials. Gate spacer layer 32 may be formed using commonly used techniques, such as plasma enhanced chemical vapor deposition (PECVD), low-pressure chemical vapor deposition (LPCVD), sub-atmospheric chemical vapor deposition (SACVD), and the like.

Figure 4:
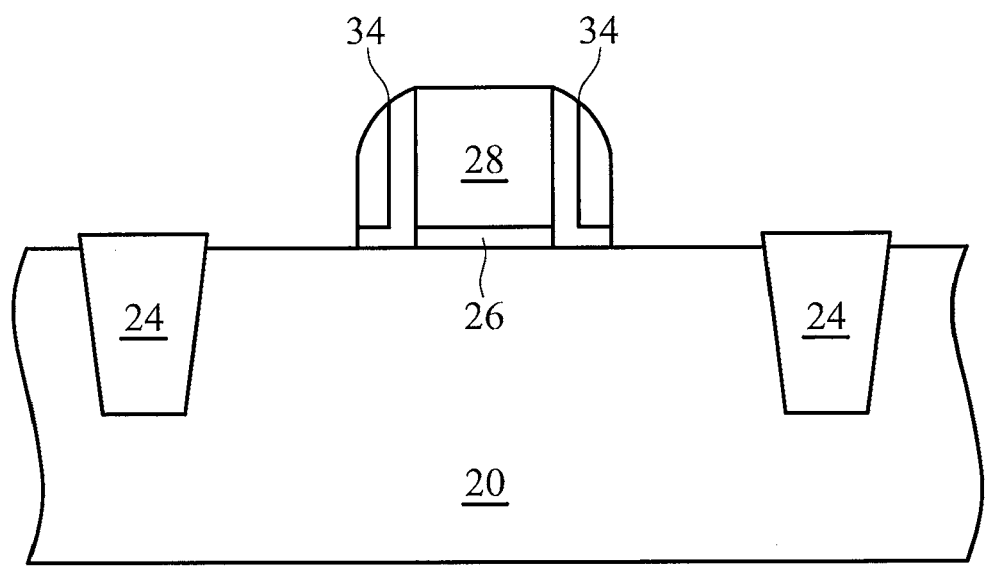

FIG. 4 illustrates the patterning of gate spacer layer 32 to form gate spacers 34, wherein the patterning may be performed by either wet etching or dry etching. Horizontal portions of gate spacer layer 32 are removed, and the remaining portions form gate spacers 34.

Figure 5:
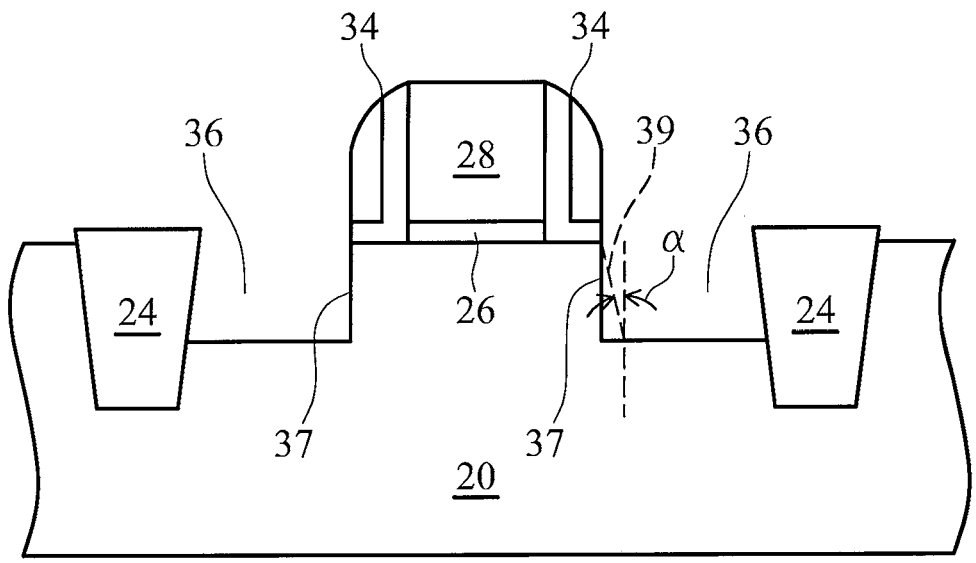

Referring to FIG. 5, recesses 36 are formed along the edges of gate spacers 34, preferably by etching anisotropically. Preferably the formation of recesses 36 is performed in an etching chamber. Plasma is preferably turned on to help form substantially vertical sidewalls 37. In an exemplary embodiment, the etching gas includes $CH_4$, and/or chlorine-containing etching gases such as $CCl_4$, HCl, and the like. Please note that sidewalls 37 may be naturally tilted with a small tilt angle $\alpha$. An exemplary sidewall 39 (dotted) is schematically illustrated to show tilt angle $\alpha$, which is greater than zero degrees. However, tilt angle $\alpha$ is typically less than about 5 degrees. Formed anisotropically, the bottom surfaces of recesses 36 tend to be substantially flat.

A further etching process is performed to form additional recesses 38, in which LDD regions are to be formed. Throughout the description, recesses 38 are alternatively referred to as LDD recesses. In a first embodiment, the formation of LDD recess 38 is performed in-situ in a same environment (chamber) as for performing an epitaxial (EPI) process, which is for filling the recesses 36 and 38. Furthermore, the LDD recess formation is performed simultaneously with a baking process, which typically occurs in the EPI environment (chamber) before the EPI process is performed. In an exemplary etching process, the substrate is placed in the EPI chamber, in which HCl gas is introduced. In addition, hydrogen may also be introduced. HCl reacts with substrate 20 and thus forming LDD recesses 38, which extends under gate spacers 34. Preferably, the etching is preformed at an elevated temperature, which also helps to bake the substrate and remove undesired chemicals. The reacting temperature is preferably higher than about 800° C., and more preferably between about 1100° C. and about 600° C. The partial pressure of HCl is preferably between about 1 torr and about 600 ton. The preferred reaction duration is greater than about 30 seconds, and more preferably between about 10 seconds and about 10 minutes. Preferably, no plasma is turned on during the formation of recesses 38. If needed, after the reaction, the baking process may continue with HCl flow turned off, and thus no HCl is introduced into the chamber during the continued baking. One skilled in the art will realize that the reaction speed (hence the preferred reaction duration) is related to the temperature and pressure of the etching gas. Typically, less time is needed with a higher temperature and/or a higher pressure.

In other embodiments of the present invention, the LDD etching is performed separately from the baking process, and may be performed in a separate environment from the EPI chamber. Other commonly used etching gases, such as $CH_4$, may also be used. During the LDD etching process, the plasma is preferably turned off.

Figure 6:
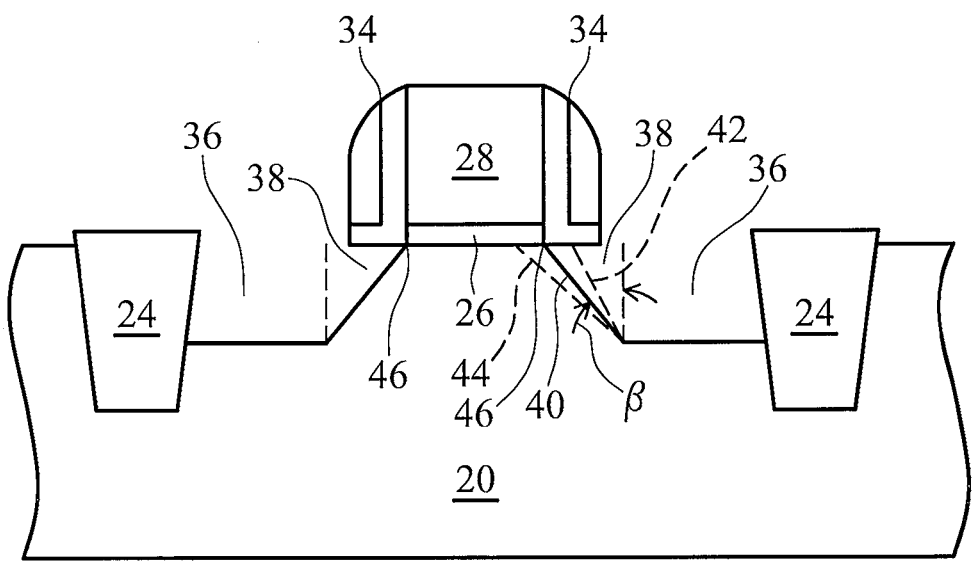

FIG. 6 illustrates a resulting structure after the formation of LDD recesses 38 are formed. It is noted that LDD recesses 38 have a triangular-shape if viewed in a plane crossing the channel length direction, as illustrated in FIG. 6. Sidewalls 40 of LDD recesses 38 are substantially straight with a tilt angle β, which is related to the etching time, the temperature, and the pressure of etching gases. With shorter etching time, lower temperature, and/or lower pressure, sidewalls with smaller tilt angles β are obtained, such as the exemplary sidewall 42. Correspondingly, the end point 46 of sidewall 42 is under gate spacers 34. Conversely, longer etching time, higher temperature, and/or higher pressure of etching gases will result in sidewalls with greater tilt angles β, such as the exemplary sidewall 44. Accordingly, when tilt angle β increases, end points 46 of sidewall 44 will be under gate electrode 28. However, regardless the values of tilt angle β, sidewalls 40, 42 and 44 are substantially straight, and thus LDD recesses 38 remain substantially triangularly shaped. Tilt angle β is preferably greater than about 10 degrees, and more preferably between about 15 degrees and about 75 degrees, and even more preferably between about 30 degrees and about 40 degrees. Although not shown in FIG. 6, one skilled in the art will realize that at the same time LDD recesses 38 are formed, the bottom surfaces of recesses 36 will also be etched down.

The mechanism for having such triangular shaped recesses 38 is not fully understood. One possible explanation is that the formation mechanism is related to the lattice direction and etching methods. Since the channel length (refer to arrow 30 in FIG. 2) is preferably in (1, 1, 0) direction of substrate 20, sidewalls 37 (refer to FIG. 5) are in (1, 1, 0) plane of substrate 20. (1, 1, 0) plane has a relatively high energy, and thus is relatively unstable and easier to be etched. The LDD etching process will cause sidewalls 40 (refer to FIG. 6) to close to (1, 1, 1) plane, which has a relatively low energy, and thus is relatively stable.

Figure 7:
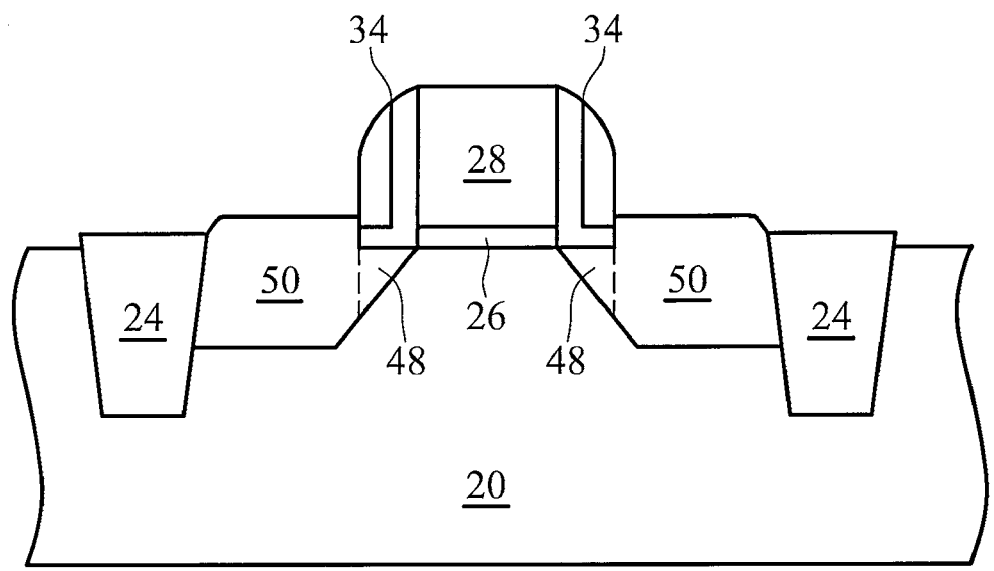

FIG. 7 illustrates the formation of epitaxial regions 50 in LDD recesses 38 and recesses 36, preferably by selective epitaxial growth (SEG). Depending on the desired type of the resulting MOS device, either stressors applying a compressive stress to the channel region, such as SiGe stressors, or stressors applying a tensile stress to the channel region, such as SiC stressors, are formed. As is known in the art, SiGe stressors are preferably formed for PMOS devices, while SiC stressors are preferably formed for NMOS devices. In an exemplary embodiment, stressors 50 are formed using plasma-enhanced chemical vapor deposition (PECVD) in a chamber. The precursors include Si-containing gases such as $SiH_4$ and a gas containing either germanium, such as $GeH_4$, if SiGe is to be formed, or a gas containing carbon, such as $C_2H_4$ or $C_2H_6$, if SiC is to be formed.

The partial pressures of the Si-containing gases and Ge-containing (or carbon-containing) gases are adjusted to modify the atomic ratio of germanium (or carbon) to silicon. In an embodiment, the resulting stressors 50 include between about 10 atomic percent and about 30 atomic percent germanium, or between about 0.5 percent and about 3 percent carbon. P-type or n-type impurities may be doped simultaneously with the epitaxial growth of stressors 50, depending on the desired type of the resulting MOS device.

In the resulting stressors 50, there is no clear boundary between LDD regions 48 and source/drain regions. However, if vertical lines are drawn to define the LDD regions 48, LDD regions 48 will be triangular shaped, wherein the vertical lines can be drawn aligned to sidewalls of gate spacers 34, or under gate spacers 34.

Figure 8:
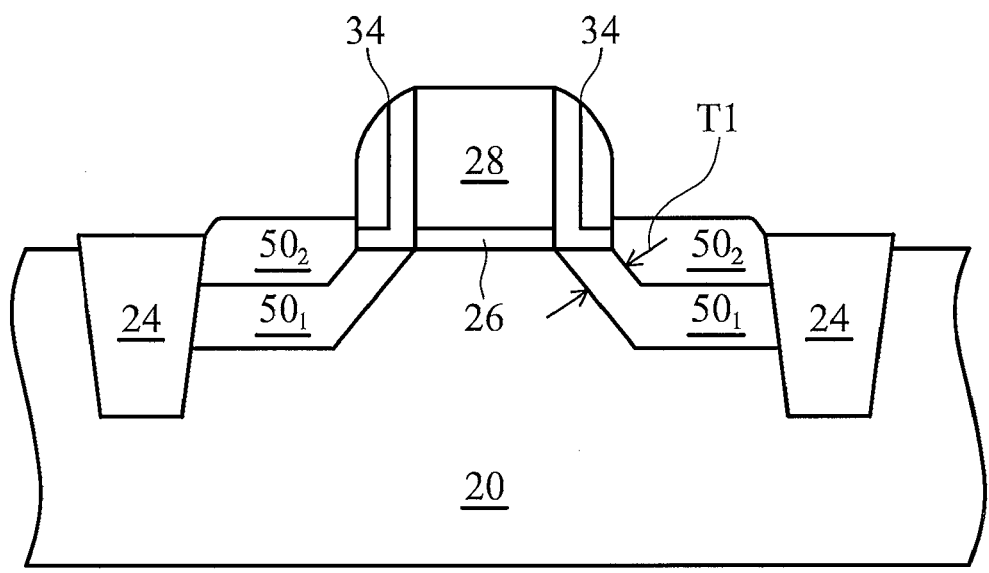

FIG. 8 illustrates another embodiment for forming stressors 50, which includes first stress layers $50_1$, and second stressor layers $50_2$ on the corresponding stressor layers $50_1$. In an exemplary embodiment, first stressor layers $50_1$ are formed substantially conformal to the exposed surfaces of recesses 36 and 38. First stressor layers $50_1$ preferably have thickness T1 of between about 100 Å and 200 Å. Preferably, first stressor layers $50_1$ and second stressor layers $50_2$ have substantially different lattice constants. In an embodiment wherein stressors 50 include germanium (or carbon), first stressor layers $50_1$ include more germanium (or carbon) than second stressor layers $50_2$. Preferably, if the desired MOS device is a PMOS device, first stressor layers $50_1$ preferably have a germanium atomic percentage of greater than about 30 percent, while second stressor layers $50_2$ preferably have a germanium atomic percentage of less than about 30 percent. In an exemplary embodiment, the difference between germanium atomic percentages in stressor layer $50_1$ and $50_2$ is greater than about five percent. Tip portions of the first stressor layers $50_1$ form the LDD regions of the resulting MOS devices. Accordingly, with the formation of first stressor layers $50_1$, the desired impurity is in-situ doped to a low impurity concentration, for example, less than about $5 \times 10^{19}/cm^3$. Alternatively, no impurity is doped during the formation of first stressor layers $50_1$. Second stressor layers $50_2$ are then formed on first stressor layers $50_1$. Second stressor layers $50_2$ are preferably doped with the desired p-type or n-type impurities to a high impurity concentration, for example, between $1E20/cm^3$ and about $5E21/cm^3$. To make first stressor layers $50_1$ conformal, process conditions need to be adjusted, for example, by increasing the partial pressure and/or flow rate of precursors, which contain silicon, germanium and/or carbon. Alternatively, since the process gases typically include an etching gas (such as HCl) in order to etch out stressor materials that are undesirably formed on dielectrics, the flow rate (or partial pressure) of the etching gas can be reduced to make the deposition process more conformal.

Figure 9:
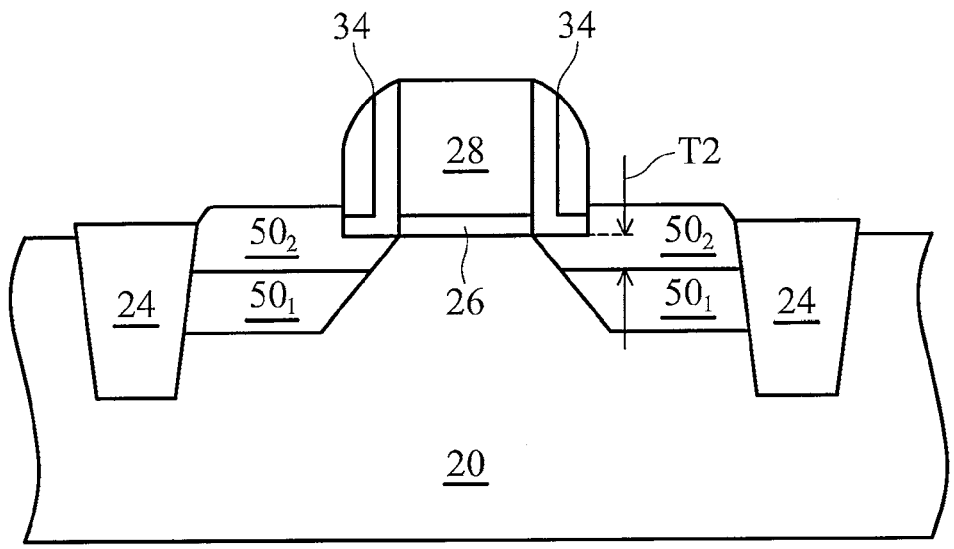

FIG. 9 illustrates yet another embodiment, in which non-conformal stressors 50 are formed. The non-conformal stressors 50 include first stressor layers $50_1$ and second stressors $50_2$ having substantially different lattice constants. First stressor layers $50_1$ preferably have substantially flat top surfaces, which are substantially lower than the channel region of the resulting MOS devices. In an exemplary embodiment, vertical distance T2 between top surfaces of the first stressor layers $50_1$ to the bottoms of spacers 34 is between about 100 Å and 200 Å. In an exemplary embodiment, first stressor layers $50_1$ have a germanium atomic percentage of less than about 30 percent, while second stressor layers $50_1$ have a germanium atomic percentage of greater than about 30 percent. In an exemplary embodiment, the difference between germanium atomic percentages in stressor layers $50_1$ and $50_2$ is greater than about five percent. A desired impurity may be in-situ doped when stressors 50 are formed. To make first stressor layers $50_1$ non-conformal, process conditions need to be adjusted, for example, by reducing the partial pressure and/or flow rate of precursors containing silicon, germanium and/or carbon. Alternatively, the flow rate of the etching gas can be increased to make the deposition process more non-conformal. One skilled in the art will be able to find optimum process conditions for forming conformal or non-conformal stressors.

Figure 10A:
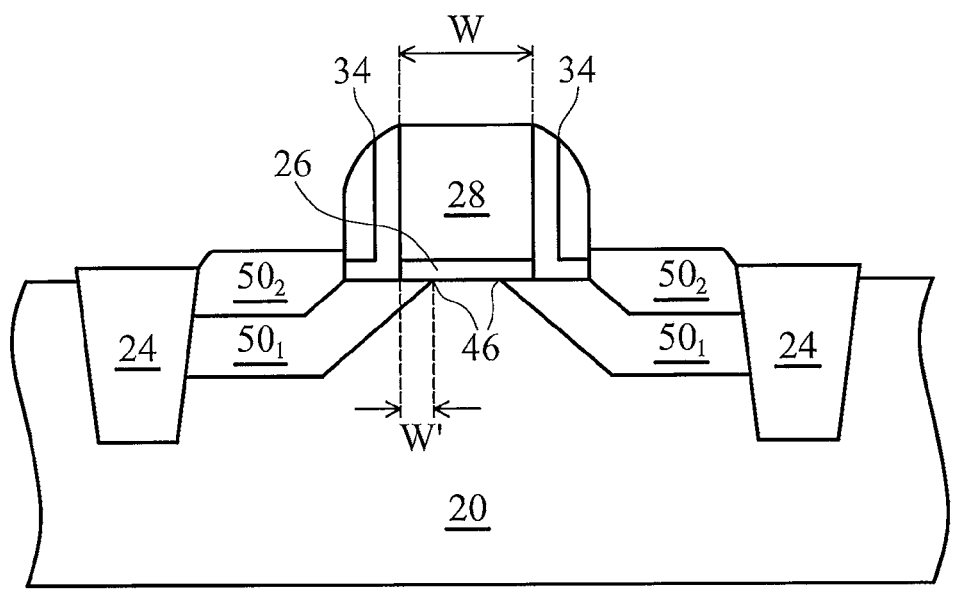
Figure 10B:
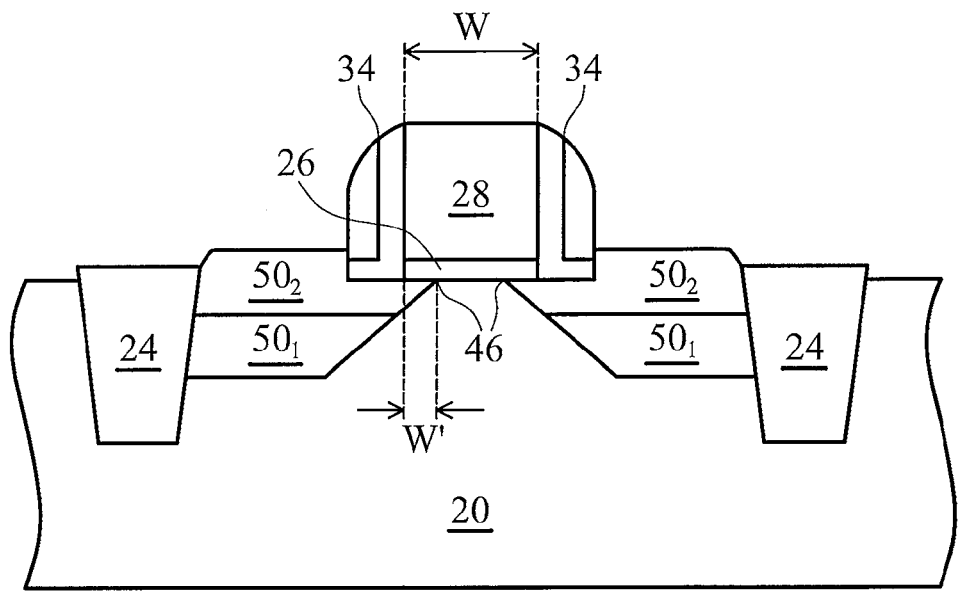

FIGS. 10A and 10B illustrate embodiments wherein the end points 46 of stressors 50 are underlying gate electrode 28. Each of the stressors 50 extends beyond the respective interface between spacer 34 and gate electrode 28 for a distance W'. In an exemplary embodiment, a ratio of distance W' to width W of gate electrode 28 is greater than about 0.05. In other exemplary embodiments, the ratio is greater than about 0.1. In yet other exemplary embodiments, the ratio is greater than about 0.25. As is known in the art, with stressors 50 close to the channel region, the stress applied on the channel region of the resulting MOS device is increased. FIG. 10A illustrates the conformal formation of stressors 50, which is similar to the embodiment shown in FIG. 8. FIG. 10B illustrates the non-conformal formation of stressors 50, which is similar to the embodiment shown in FIG. 9.

Figure 11:
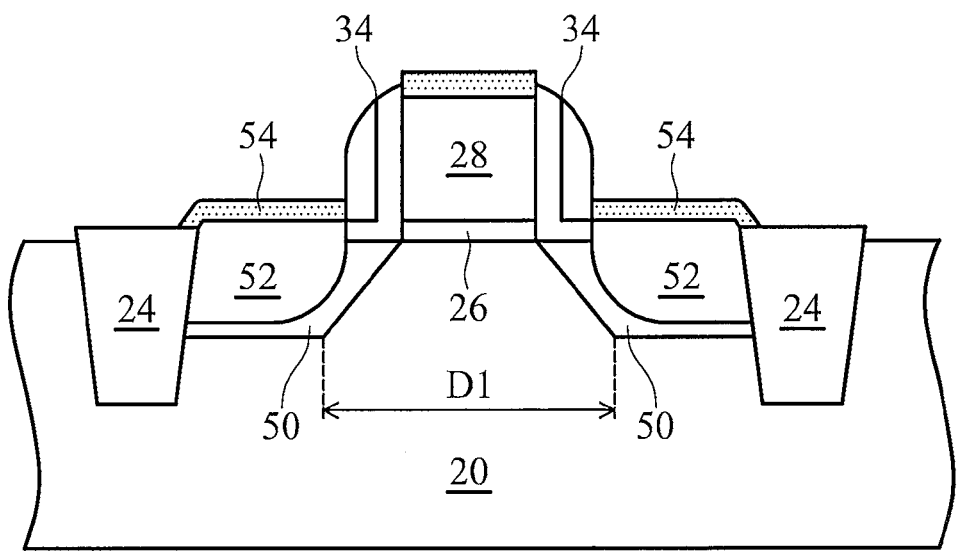

After the formation of stressors 50, an optional source/drain implantation may be further performed to form source/drain regions 52, as is shown in FIG. 11. As is known in the art, for a PMOS device, source/drain regions 52 include p-type impurities, such as boron and/or indium, while for an NMOS device, source/drain regions 52 include n-type impurities, such as phosphorous and/or arsenic. One skilled in the art will realize the process details.

FIG. 11 also illustrates the formation of silicide regions 54. As is known in the art, silicide regions 54 are preferably formed by blanket depositing a thin layer of metal, such as nickel, platinum, palladium, vanadium, titanium, cobalt, tantalum, ytterbium, zirconium, and combinations thereof. The substrate is then heated, which causes silicon to react with the metal where contacted. After the reaction, a layer of metal silicide is formed between silicon/germanium and metal. The un-reacted metal is selectively removed through the use of an etchant that attacks metal but does not attack silicide and silicide.

By forming triangular-shaped stressors, the distance D1 between bottoms of source and drain regions is increased, the possibility of punch-through is thus reduced. In LDD regions, however, stressors are formed close to the channel regions, and thus the applied stress is increased. A simulation has been performed to compare the stresses in a conventional MOS device and MOS device embodiments of the present invention. The conventional MOS device has stressors with a same shape as recesses 36 in FIG. 5. The simulated stress is about 1.26 GPa. The stresses simulated from embodiments of the present invention are greater than the stress obtained from the conventional MOS device. It is found that by increasing the angle β of the LDD recesses 38 (refer to FIG. 6), the stress applied to the channel region increases. When the end points 46 of the triangle are aligned to an edge of the gate electrode 28, the stress is increased to about 1.86 GPa.

An advantageous feature of the preferred embodiment is that the formation of triangular-shaped LDD recesses may be combined with existing pre-EPI baking process, and thus no additional process steps are needed.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
a semiconductor substrate;
a gate stack on the semiconductor substrate;
a gate spacer on a sidewall of the gate stack;
a lightly doped source or drain (LDD) region comprising a different material from the semiconductor substrate, wherein the LDD region has at least a portion underlying the gate spacer, and wherein the LDD region has a tilted interface with the semiconductor substrate; and
a source/drain region adjacent the gate spacer, wherein the source/drain region and the LDD region comprise an element selected from the group consisting essentially of germanium and carbon, and wherein atomic percentages of the element in the LDD region and at least a portion of the source/drain region are different.

2. The semiconductor structure of claim 1, wherein the LDD region has a substantially straight tilted interface with the semiconductor substrate.

3. The semiconductor structure of claim 1, wherein the tilted interface has a tilt angle of between about 15 degrees and about 75 degrees.

4. The semiconductor structure of claim 1, wherein the source/drain region comprises a first layer and a second layer, both the first layer and the second layer having a different lattice structure than the semiconductor substrate.

5. The semiconductor structure of claim 1, wherein the LDD region extends under the gate stack.

6. A semiconductor structure comprising:
a semiconductor substrate;
a gate structure on the semiconductor substrate;
recesses in the semiconductor substrate on opposing sides of the semiconductor substrate, the recesses having a tilted sidewall extending toward the gate structure, the tilted sidewall being tilted relative to normal to the semiconductor substrate from a bottom of the respective recesses to a surface of the semiconductor substrate;
a first semiconductor layer in the recesses, the first semiconductor layer having a different lattice constant than the semiconductor substrate, the first semiconductor layer having an upper surface lower than an upper surface of the semiconductor substrate, the first semiconductor layer comprising a first compound, the first compound comprising a first element and a second element; and
a second semiconductor layer in the recesses, the second semiconductor layer having a different lattice constant than the first semiconductor layer and the semiconductor substrate, the second semiconductor layer comprising a second compound, the second compound comprising the first element and the second element.

7. The semiconductor structure of claim 6, further comprising lightly doped source/drain (LDD) regions, boundaries of the LDD regions being defined by the recesses.

8. The semiconductor structure of claim 6, wherein the recesses extend below the gate structure.

9. The semiconductor structure of claim 8, wherein a distance the recesses extend below the gate structure is greater than about ten percent of a width of the gate structure.

10. The semiconductor structure of claim 6, wherein the titled sidewall of the recesses has a tilt angle greater than about 15 degrees from normal to the semiconductor substrate.

11. The semiconductor structure of claim 6, wherein the tilted sidewall is substantially in a (1, 1, 1) direction of the semiconductor substrate.

12. The semiconductor structure of claim 6, wherein the first semiconductor layer is conformal, and wherein the first semiconductor layer has a germanium atomic percentage substantially greater than a germanium atomic percentage of the second semiconductor layer.

13. The semiconductor structure of claim 6, wherein the first semiconductor layer is non-conformal, and wherein the first semiconductor layer has a germanium atomic percentage substantially less than a germanium atomic percentage of the second semiconductor layer.

14. A semiconductor structure comprising:
a semiconductor substrate;
a gate structure on the semiconductor substrate;
source/drain recesses in the substrate on opposing sides of the semiconductor substrate, the source/drain recesses having a tilted sidewall extending toward the gate structure;
a first semiconductor layer in the source/drain recesses, the first semiconductor layer having a different lattice constant than the semiconductor substrate, the first semiconductor layer having an upper surface lower than an upper surface of the semiconductor substrate; and
a second semiconductor layer in the source/drain recesses, the second semiconductor layer having a different lattice constant than the first semiconductor layer and the semiconductor substrate, wherein the second semiconductor layer comprises lightly doped drain (LDD) regions, the extent to which the LDD regions on opposing sides of the gate structure extend toward each other being controlled by the first semiconductor layer or the second semiconductor layer within the source/drain recesses.

15. The semiconductor structure of claim 14, wherein the source/drain recesses extend below the gate structure.

16. The semiconductor structure of claim 15, wherein a distance the source/drain recesses extend below the gate structure is greater than about ten percent of a width of the gate structure.

17. The semiconductor structure of claim 14, wherein the titled sidewall of the source/drain recesses has a tilt angle greater than about 15 degrees from normal to an uppermost surface of the semiconductor substrate.

18. The semiconductor structure of claim 14, wherein the tilted sidewall is substantially in a (1, 1, 1) direction of the semiconductor substrate.

19. The semiconductor structure of claim 14, wherein the first semiconductor layer is conformal, and wherein the first semiconductor layer has a germanium atomic percentage substantially greater than a germanium atomic percentage of the second semiconductor layer.

20. The semiconductor structure of claim 14, wherein the first semiconductor layer is non-conformal, and wherein the first semiconductor layer has a germanium atomic percentage substantially less than a germanium atomic percentage of the second semiconductor layer.

21. A semiconductor structure comprising:
a semiconductor substrate;
a gate structure on the semiconductor substrate;
recesses in the semiconductor substrate on opposing sides of the semiconductor substrate, the recesses having a tilted sidewall extending toward the gate structure, the tilted sidewall being tilted relative to normal to the semiconductor substrate from a bottom of the respective recesses to a surface of the semiconductor substrate;
a first semiconductor layer in the recesses, the first semiconductor layer having a different lattice constant than the semiconductor substrate, the first semiconductor layer having an upper surface lower than an upper surface of the semiconductor substrate; and
a second semiconductor layer in the recesses, the second semiconductor layer having a different lattice constant than the first semiconductor layer and the semiconductor substrate;
wherein the tilted sidewall is substantially in a (1, 1, 1) direction of the semiconductor substrate.

22. A semiconductor structure comprising:
a semiconductor substrate;
a gate structure on the semiconductor substrate;
recesses in the semiconductor substrate on opposing sides of the semiconductor substrate, the recesses having a tilted sidewall extending toward the gate structure, the tilted sidewall being tilted relative to normal to the semiconductor substrate from a bottom of the respective recesses to a surface of the semiconductor substrate;
a first semiconductor layer in the recesses, the first semiconductor layer having a different lattice constant than the semiconductor substrate, the first semiconductor layer having an upper surface lower than an upper surface of the semiconductor substrate; and
a second semiconductor layer in the recesses, the second semiconductor layer having a different lattice constant than the first semiconductor layer and the semiconductor substrate;
wherein the first semiconductor layer is conformal, and wherein the first semiconductor layer has a germanium atomic percentage substantially greater than a germanium atomic percentage of the second semiconductor layer.

23. A semiconductor structure comprising:
a semiconductor substrate;
a gate structure on the semiconductor substrate;
recesses in the semiconductor substrate on opposing sides of the semiconductor substrate, the recesses having a tilted sidewall extending toward the gate structure, the tilted sidewall being tilted relative to normal to the semiconductor substrate from a bottom of the respective recesses to a surface of the semiconductor substrate;
a first semiconductor layer in the recesses, the first semiconductor layer having a different lattice constant than the semiconductor substrate, the first semiconductor layer having an upper surface lower than an upper surface of the semiconductor substrate; and
a second semiconductor layer in the recesses, the second semiconductor layer having a different lattice constant than the first semiconductor layer and the semiconductor substrate;
wherein the first semiconductor layer is non-conformal, and wherein the first semiconductor layer has a germanium atomic percentage substantially less than a germanium atomic percentage of the second semiconductor layer.

* * * * *